(12) United States Patent
Gotoh et al.

(10) Patent No.: US 8,970,816 B2
(45) Date of Patent: Mar. 3, 2015

(54) DISPLAY DEVICE

(75) Inventors: Jun Gotoh, Mobara (JP); Takanori Nakayama, Mobara (JP)

(73) Assignees: Japan Display Inc., Tokyo (JP); Panasonic Liquid Crystal Display Co., Ltd., Hyogo (JP)

( * ) Notice: Subject to any disclaimer, the term of this patent is extended or adjusted under 35 U.S.C. 154(b) by 1056 days.

(21) Appl. No.: 12/785,890

(22) Filed: May 24, 2010

(65) Prior Publication Data

US 2010/0309421 A1 Dec. 9, 2010

(30) Foreign Application Priority Data

Jun. 3, 2009 (JP) ................................. 2009-133762

(51) Int. Cl.
*G02F 1/1345* (2006.01)
*G02F 1/1362* (2006.01)
*H01L 27/32* (2006.01)

(52) U.S. Cl.
CPC ....... *G02F 1/136259* (2013.01); *H01L 27/3276* (2013.01)
USPC ............................................ 349/152; 349/54

(58) Field of Classification Search
None
See application file for complete search history.

(56) References Cited

U.S. PATENT DOCUMENTS

| 6,882,378 | B2 | 4/2005 | Nagata et al. | |
|---|---|---|---|---|
| 7,884,892 | B2 * | 2/2011 | Ishii | 349/54 |
| 8,531,617 | B2 * | 9/2013 | Kim et al. | 349/40 |
| 2007/0046581 | A1 | 3/2007 | Kwak et al. | |
| 2008/0036711 | A1 | 2/2008 | Kwak et al. | |
| 2008/0123013 | A1 | 5/2008 | Kim | |
| 2009/0207352 | A1 * | 8/2009 | Moriyama et al. | 349/116 |

FOREIGN PATENT DOCUMENTS

| CN | 101123069 | 2/2008 |
|---|---|---|
| JP | 2002-341377 | 11/2002 |
| JP | 2004-325956 | 11/2004 |
| KR | 10-0636502 | 10/2006 |
| KR | 10-2008-0048906 | 6/2008 |

* cited by examiner

*Primary Examiner* — Richard Kim
(74) *Attorney, Agent, or Firm* — Lowe Hauptman & Ham, LLP

(57) ABSTRACT

In a liquid crystal display device it is desirable to test in the state of TFT substrates, without reducing the number of TFT substrates to be obtained from one mother TFT substrate, and without increasing the overall size of the TFT substrates. Test terminals are formed on the outside of terminals for driving the liquid crystal display device. The test terminals of the specific TFT substrate are formed in another TFT substrate just below the specific TFT substrate. The area in which the test lines are formed is a space in which a sealing material is formed, between the display area and an end of the lower TFT substrate. Thus, the size of the TFT substrates is not actually increased. A test line area is not separately formed and not discarded, so that the number of TFT substrates to be obtained from one mother TFT substrate is not reduced.

3 Claims, 10 Drawing Sheets

DISPLAY DEVICE

CLAIM OF PRIORITY

The present application claims priority from Japanese Patent Application JP 2009-133762 filed on Jun. 3, 2009, the content of which is hereby incorporated by reference into this application.

FIELD OF THE INVENTION

The present invention relates to a display device, and more particularly, to a liquid crystal display device in which lines or thin film transistors in a substrate can be tested during the production process, allowing the production yield to be increased.

BACKGROUND OF THE INVENTION

A conventional liquid crystal display device has a TFT substrate and a counter substrate disposed opposite to the TFT substrate. In the TFT substrate, pixel electrodes, thin film transistors (TFTs) and the like are arranged in a matrix form. In the counter substrate, color filters and the like are arranged at locations corresponding to the pixel electrodes of the TFT substrate. A liquid crystal is interposed between the TFT substrate and the counter substrate. Then, an image is formed by controlling the transmittance of light of the liquid crystal molecules for each pixel.

In order to increase the production efficiency of the liquid crystal display device, plural TFT substrates are formed in a mother TFT substrate, and plural counter substrates are formed in a mother counter substrate. The mother TFT substrate and the mother counter substrate are bonded together by a sealing material to form a mother panel including plural liquid crystal cells. The individual liquid crystal cells are separated from the mother panel by scribing or other suitable methods.

The TFT substrate has a large number of pixels each having a TFT and a pixel electrode. Further, a large number of scan lines, image signal lines and the like are formed in the TFT substrate. Because of this configuration, defects such as disconnection and short circuit are likely to occur in TFTs, pixel electrodes, and various lines. If such defects are found in the state of the mother TFT substrate, the following process will no longer be necessary for the defective cell. Further, if a large number of defective TFT substrates are present in the mother TFT substrate, the mother TFT substrate itself will no longer be conveyed to the post process.

JP-A No. 341377/2002 describes a technology for testing a TFT substrate to detect defects in the state of the TFT substrate. In other words, with the technology described in JP-A No. 341377/2002, it is possible to test the presence of a defect in all pixels by using two testing short bars for gate lines, using three testing short bars for image signal lines, and inputting different testing signals to each of the short bars.

The technology described in JP-A No. 341377/2002 uses two test lines for scan lines, and three test lines for image signal lines. In other words, it is necessary to form an area for the test lines in the mother TFT substrate in order to perform the test in the state of the TFT substrate. Depending on the content of the test, the number of test lines is increased and the area of the test lines is increased. As a result, the number of TFT substrates to be formed in one mother TFT substrate is reduced. This leads to an increase in the production cost of the liquid crystal display panel.

The liquid crystal display device is divided into two types based on the materials from which TFT is formed, namely, poly-Si and a-Si. TFT formed from poly-Si is the type called LTPS (Low Temperature poly-Si). In the LTPS type, a driving circuit can be formed on the outside of the display area in the TFT substrate. The driving circuit can be used to detect pixel defects, as well as line defects such as disconnection and short circuit. More specifically, in the TFT of LTPS type, pixel defects and line defects are detected by measuring the size of the storage capacity formed in the pixel. Thus, in the TFT of LTPS type, it is possible to test defects in the state of the TFT substrate, without causing a problem of the area of the test lines.

In the case of the TFT of a-Si type used in large liquid crystal display panels, such as TV panels, each pixel is large. Thus, it is possible to test defects in the pixels and lines without providing different test lines and test terminals. In other words, in the large TFT substrate, all the pixels are turned ON to detect defects in the pixels and lines, for example, by scanning the display area by electron beams and by testing the potential of the surface of each pixel. It is also possible to detect the pixel defects by providing a liquid crystal pack seal on the surface of the display area of the TFT substrate, instead of scanning the display area by electron beams.

However, in the case of the TFT of a-Si type used in small and medium sized liquid crystal display panels, the size of each pixel is small. Thus, it is difficult to apply the test method used in the large liquid crystal display device as described above. In this case, it is necessary to provide lines and terminals for testing in the state of the TFT substrate. If the test is not performed in the state of the TFT substrate, such lines and terminals for the test may not be necessary. If the area of the lines and terminals for the test is increased, there is a problem that the number of TFT substrates to be obtained from one mother TFT substrate is reduced.

SUMMARY OF THE INVENTION

It is desirable to solve the above problem, and to provide a configuration that allows for testing in the state of the TFT substrates, without reducing the number of TFT substrates to be obtained from one mother TFT substrate.

The present invention overcomes the above problem by the following means.

(1) In a liquid crystal display device, a TFT substrate includes a display area in which pixels each having a pixel electrode and a TFT are arranged in a matrix form, as well as a terminal portion. The display area has scan lines extending in a first direction and arranged in a second direction, image signal lines extending in the second direction and arranged in the first direction, and a common line. A counter substrate is disposed opposite to the TFT substrate. The TFT substrate and the counter substrate are bonded together by a sealing material formed in the periphery. A driving terminal and a test terminal are formed in the terminal portion. Plural lines are formed on the side opposite to the side on which the terminal portion is formed. The plural lines are not connected to the scan lines, the image signal lines, and the common line, and are arranged parallel to the side opposite to the side on which the terminal portion is formed.

(2) The liquid crystal display device described in (1), wherein the plural lines are floated.

(3) The liquid crystal display device described in (1), wherein the plural lines are used for the test of a TFT substrate of another liquid crystal display device.

(4) In a liquid crystal display device, a TFT substrate includes a display area in which pixels each having a pixel electrode and a TFT are arranged in a matrix form, as well as a terminal portion. The display area has scan lines extending in a first direction and arranged in a second direction, and image signal lines extending in the second direction and arranged in the first direction. A counter substrate is disposed opposite to the TFT substrate. The TFT substrate and the counter substrate are bonded together by a sealing material formed in the periphery. A driving terminal and a test terminal are formed in the terminal portion. Plural lines are formed on the side opposite to the side on which the terminal portion is formed. The plural lines are not connected to the scan lines or the image signal lines, and are arranged parallel to the side opposite to the side on which the terminal portion is formed. The plural lines are formed between the side opposite to the side on which the terminal portion is formed, and the display area. Leaders extend from the plural lines to the side opposite to the side on which the terminal portion is formed.

(5) The liquid crystal display device described in (4), wherein the plural lines are formed on a lower layer of the sealing material through an insulating film.

(6) In a liquid crystal display device, a TFT substrate includes a display area in which pixels each having a pixel electrode and a TFT are arranged in a matrix form, as well as a terminal portion. The display area has scan lines extending in a first direction and arranged in a second direction, image signal lines extending in the second direction and arranged in the first direction, and a common line. A counter substrate is disposed opposite to the TFT substrate. The TFT substrate and the counter substrate are bonded together by a sealing material formed in the periphery. A driving terminal and a test terminal are formed in the terminal portion. Plural first lines are formed between the side on which the terminal portion is formed, and the test terminal. The plural first lines are connected to the test terminal, and are arranged parallel to the side on which the terminal portion is formed. Plural second lines are formed on the side opposite to the side on which the terminal portion is formed. The plural second lines are not connected to the scan lines, the image signal lines, and the common line, and are arranged parallel to the side opposite to the side on which the terminal portion is formed.

(7) The liquid crystal display device described in (6), wherein the plural first lines and second lines are used for the test of the TFT substrate.

(8) In an organic electroluminescence display device, a device substrate includes a display area in which pixels each having an organic EL light emitting layer and a TFT are arranged in a matrix form, as well as a terminal portion. The display area has scan lines extending in a first direction and arranged in a second direction, and image signal lines extending in the second direction and arranged in the first direction. A sealing substrate is disposed opposite to the device substrate. The device substrate and the sealing substrate are bonded together by a sealing material formed in the periphery. A driving terminal and a test terminal are formed in the terminal portion. Plural lines are formed on the side opposite to the side on which the terminal portion is formed. The plural lines are not connected to the scan lines, the image signal lines and the common line, and are arranged parallel to the side opposite to the side on which the terminal portion is formed.

According to the present invention, it is possible to test defects such as short circuit and disconnection in the state of the mother TFT substrate, without reducing the number of TFT substrates to be obtained from one mother TFT substrate, and without increasing the overall size of the individual TFT substrates. The post process steps may not be necessary for the defective substrate, so that the production efficiency of the liquid crystal display device can be increased. This is the same for the device substrate of the organic electroluminescence display device.

DETAILED DESCRIPTION OF THE PREFERRED EMBODIMENTS

Before specific embodiments of the present invention are described, the description will focus on a liquid crystal display device to which the present invention is applied, as well as the problem in the case in which the present invention is not applied.

Figure 6:
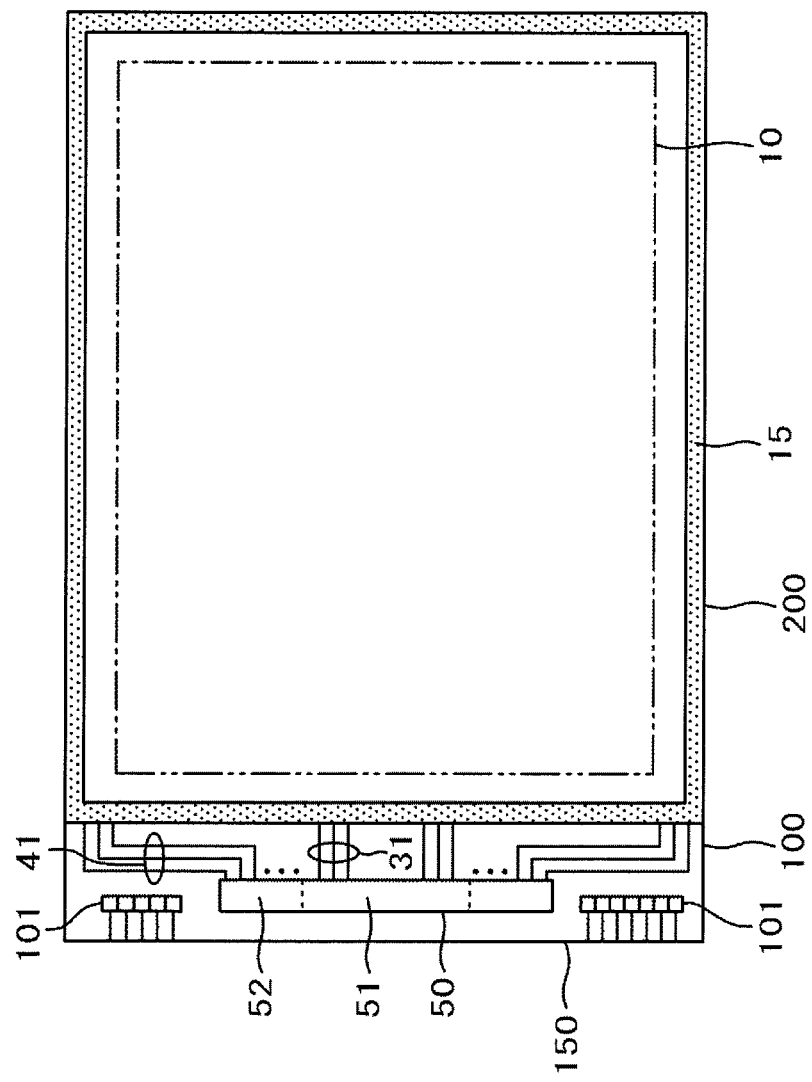
FIG. 6 is a top view of the liquid crystal display device to which the present invention is applied.

FIG. 6 shows an example of a liquid crystal display device to which the present invention is applied. FIG. 6 shows, for example, a liquid crystal display device used for DSC (Digital Still Camera) or other electronic devices. The liquid crystal display device of this type is small and has a horizontally long display area, in which a terminal portion is provided in the horizontal direction. FIG. 6 is an example of the liquid crystal display device to which the present invention is applied. It goes without saying that the present invention can also be applied to other liquid crystal display devices such as those used for mobile phones. The liquid crystal display devices of this type have a vertically long display area, in which a terminal portion is formed downward.

In FIG. 6, a counter substrate 200 is placed above a TFT substrate 100. A liquid crystal layer is interposed between the TFT substrate 100 and the counter substrate 200. The TFT substrate 100 and the counter substrate 200 are bonded together by a sealing material 15 formed in the periphery.

In FIG. 6, the liquid crystal display device uses a method of sealing by dropping liquid crystal into the liquid crystal display device, without forming a sealing hole in the liquid crystal display device. The TFT substrate 100 is made greater than the counter substrate 200. A terminal portion 150 is formed in a portion of the TFT substrate 100 extending beyond the counter substrate 200. The terminal portion 150 supplies power, image signals, scan signals and the like to the liquid crystal display panel.

Further, an IC driver 50 is formed in the terminal portion 150 to drive scan lines, image signal lines and the like. The IC driver 50 is divided into three areas. In the center area of the three areas, a scan signal driving circuit 51 is provided. Image signal driving circuits 52 are provided in the two areas on both sides of the IC driver 50.

In a display area 10 of FIG. 6, the scan lines, not shown, extend in the horizontal direction and are arranged in the vertical direction. Further, the image signal lines, not shown, extend in the vertical direction and are arranged in the horizontal direction. The scan lines are connected by leaders 31 to the scan signal driving circuit 51 of the IC driver 50. In FIG. 6, the image signal line leaders 41 are provided in the top and bottom of the display area 10, in order to provide the display area 10 in the center of the liquid crystal display device. Thus, the image signal driving circuits 52 are provided in the two areas on both sides of the IC driver 50. The scan signal line leaders 31 for connecting the scan lines to the IC driver 50 all extend to the center of the display. The scan line leaders 31 are connected to the scan line signal circuit 51 provided in the center of the IC driver 50.

In FIG. 6, the distance from the end of the display area 10 to the inner end of the sealing material 15 is about 1 mm. The width of the sealing material 15 is about 1 mm in the smallest. Thus, the distance from the end of the display area 10 to the outer end of the sealing material 15 is about 2 mm. The area from the end of the display area 10 to the outer end of the sealing material 15 is called a frame area.

In FIG. 6, the terminal portion 150 is provided with test terminals 101 connected to the driving terminals through test switches described below, in addition to the driving terminals for driving the IC driver 50 and the liquid crystal display device. Further, the test terminals 101 are connected to test lines and external test terminals. The test lines and the test terminals are formed on the outside of the liquid crystal display device shown in FIG. 6. The test terminals 101 are used to make it possible to test the liquid crystal display panel in the state of the TFT substrate.

Figure 7:
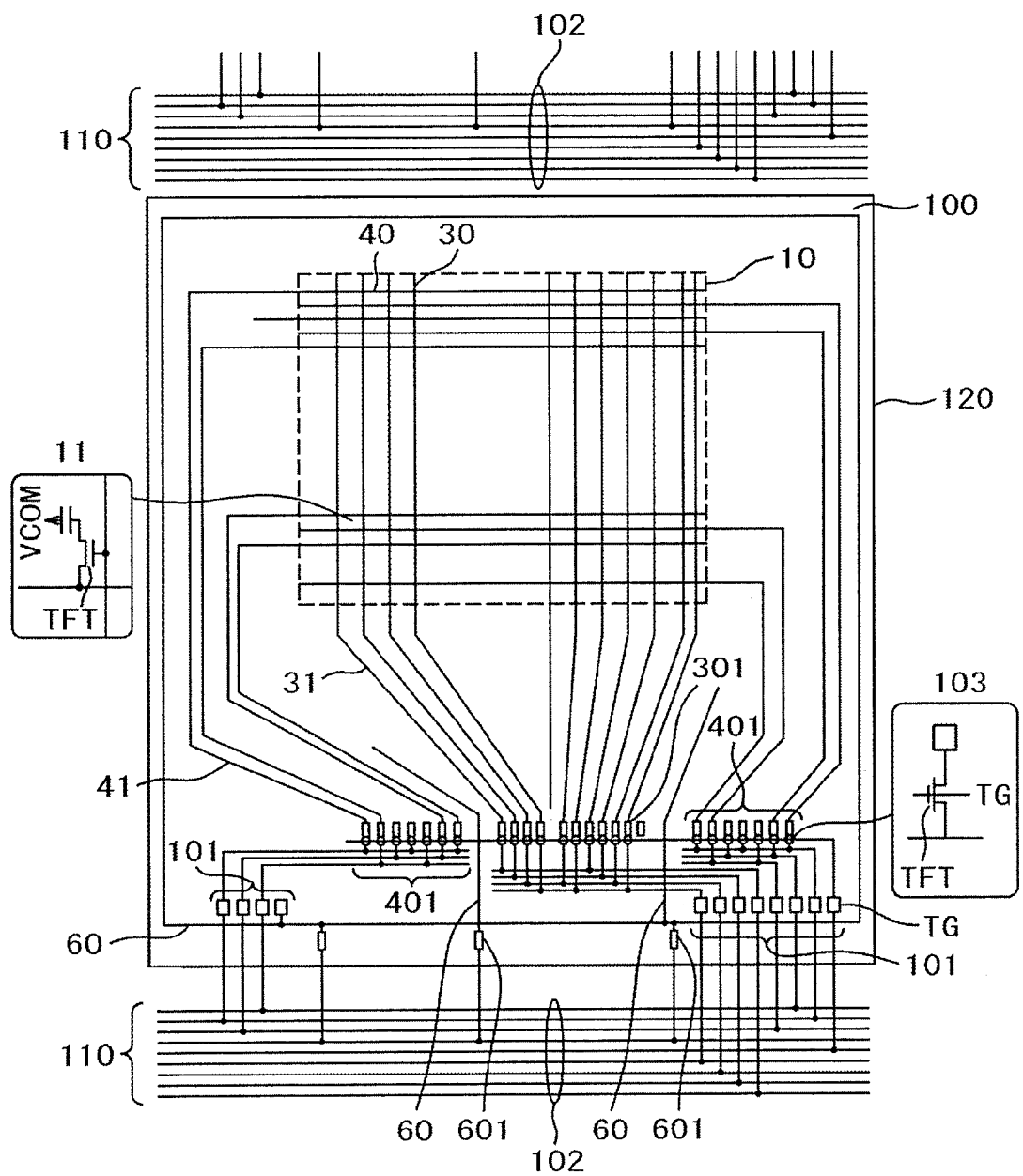
FIG. 7 is a wiring diagram of a TFT substrate of a liquid crystal display device to which the present invention is not applied.
Figure 8:
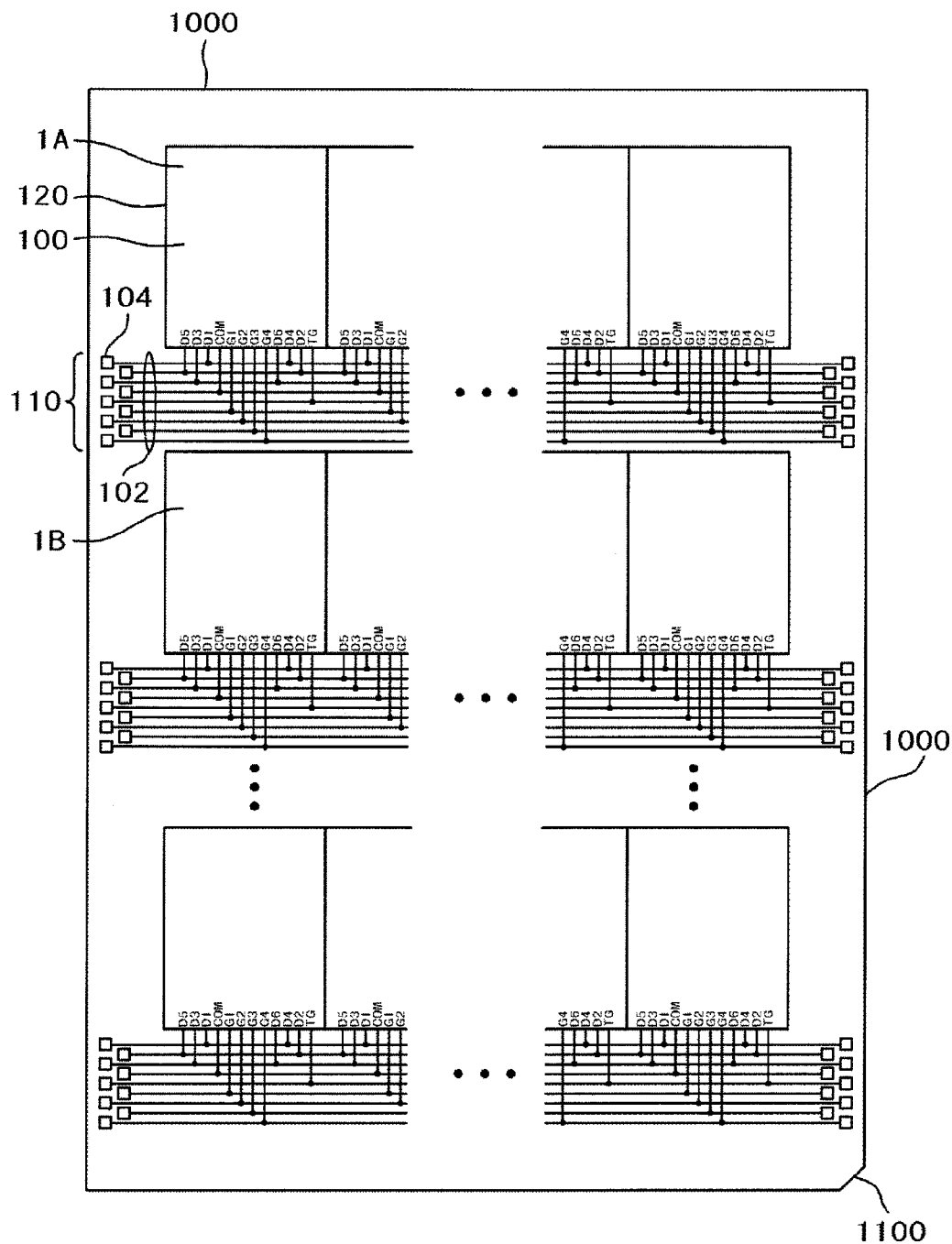
FIG. 8 is a top view of the arrangement of TFT substrates and test lines in a mother TFT substrate to which the present invention is not applied.

FIG. 7 is a top view showing the wiring of the TFT substrate 100 in FIG. 6. FIG. 8 is a top view in which the TFT substrates 100, each shown in FIG. 7, are arranged in a mother TFT substrate 1000. FIG. 7 is rotated 90 degrees relative to FIG. 6. Although the liquid crystal display device is horizontal in the state of the product as shown in FIG. 6, it may be preferable that the liquid crystal display device is vertically oriented in the production process as shown in FIG. 8. Here, the liquid crystal display panel is vertically arranged in the mother TFT substrate 1000 to make the description of the present invention easier to understand.

FIG. 7 is a top view of the TFT substrate 100 before it is individually separated from the mother TFT substrate 1000. In FIG. 7, the lines and the terminal portion 150 are enlarged for easier viewing. In FIG. 7, the individual TFT substrate is shown within a cutting line 120.

The display area 10 is formed within the TFT substrate 100. In the display area 10, image signal lines 40 extend in the horizontal direction and are arranged in the vertical direction, and scan lines 30 extend in the vertical direction and are arranged in the horizontal direction. In FIG. 7, the vertical and horizontal directions are opposite to the directions in FIG. 6. The image signal lines 40 are connected to image signal line terminals 401 through the image signal line leaders 41. The scan lines 30 are connected to scan line terminals 301 through the scan line leaders 31.

In FIG. 7, a pixel 11 is an area surrounded by the image signal lines 40 extending in the horizontal direction, and the scan lines 30 extending in the vertical direction. As shown in FIG. 7, the pixel 11 includes a TFT and a capacity representing a liquid crystal. A drain electrode of the TFT within the pixel 11 is connected to the image signal line 40. A source electrode is connected to a pixel electrode. A liquid crystal layer is interposed between the pixel electrode and a common electrode. The liquid crystal layer is shown as the capacity in FIG. 7.

In FIG. 7, the scan line terminals 301 are disposed in a central portion of the TFT substrate 100. The image signal terminals 401 are disposed separately in the left and right scan line terminals 301. A common line 60 is formed between the scan line terminals 301 and the image signal line terminals 401. The common line 60 goes around the TFT substrate 100 to surround the display area 10 and the terminals. In this way, the interior of the TFT substrate 100 is sealed and the potential is stabilized. Common line terminals 601 are formed on just the outside of the common line 60.

The test terminals 101 are provided below the scan line terminals 301 and the image signal line terminals 401. The number of test items of the test terminal 101 is limited, requiring a smaller number of test terminals than the number of the image signal line terminals 301 or the scan line terminals 401. In FIG. 6, there are 12 test terminals 101. The test terminals 101 are separated into the scan line terminals 301 or the image signal terminals 401 by test switches 103.

As shown in FIG. 7, the test switch 103 includes a TFT. A terminal TG on the right side of the test terminals 101 is connected to a gate line of the TFT of the test switch 103. Thus, the test switch 103 can be turned ON and OFF by a voltage applied to the terminal TG. It is to be noted that the gate voltage supplied from the terminal TG is effective for all the test switches 103 between the scan line terminals 301 and the image signal line terminals 401, and the test terminals 101 at the same time.

In FIG. 7, of the 12 test terminals 101, one is the terminal TG connected to the gate electrode of the test switch 103, four are connected to the scan line terminals 301, six are connected to the image signal line terminals 401, and one is connected to the common line 60. When the test terminals 101 of FIG. 6 are used in the stage of the production process of the TFT substrates 100, the TFT substrate 100 is individually tested in an ineffective manner. For this reason, the test terminals 101 are connected to the test lines 102 formed on the outside of the TFT substrates 100. Then, all the TFT substrates 100 arranged in the horizontal direction are tested at the same time from the test lines 102. In FIG. 7, the TFT substrate 100 is individually separated from the mother TFT substrate 1000 by scribing or other suitable means along the cutting line 120.

FIG. 8 is a top view in which the TFT substrates 100, each shown in FIG. 7, are formed in one mother TFT substrate 1000. On the right bottom of FIG. 8, an orientation flat 1100 is formed to confirm the orientation of the mother TFT substrate 1000. In FIG. 8, the lines within the TFT substrate 100 are omitted. There are shown 12 terminals as the test terminals 101 of each TFT substrate 100, in which D1 to D6 are connected to the image signal lines 40, G1 to G3 are connected to the scan lines 30, COM is connected to the common line 60, and TG is connected to the gate of the test switch 103.

As shown in FIG. 8, the TFT substrates 100, as well as test line areas 110 for testing the TFT substrates 100 are formed in the mother TFT substrate 1000. The number of the test lines 102 formed in the test line area 110 is 9. External test terminals 104 are formed on both sides of the mother TFT substrate 1000 in order to supply voltage to the test lines 102. The test of the test substrate 100 is performed by the external test terminals 104.

The mother TFT substrate 1000 is completed as described above. Then, the completed mother TFT substrate 1000 is bonded to another mother TFT substrate to form a mother panel. Then, individual liquid crystal cells are separated from the mother panel along the cutting lines 120. At this time, the test line areas 110 are discarded. In other words, the number of the TFT substrates 100 to be obtained from one mother TFT substrate 1000 is reduced due to the formation of the test line areas 110.

Figure 9:
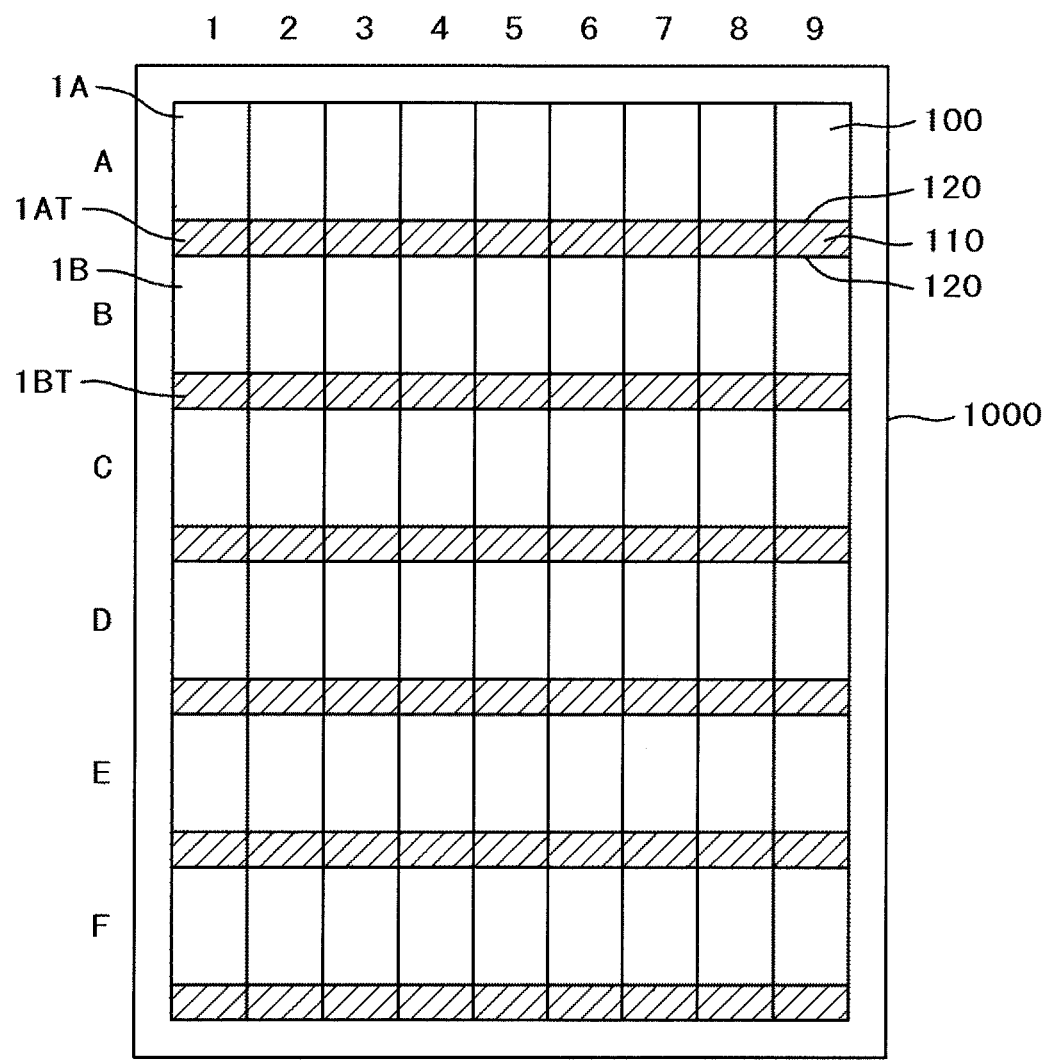
FIG. 9 is a top view of the arrangement of TFT substrates and test line areas in the mother TFT substrate to which the present invention is not applied.

FIG. 9 shows this state. In FIG. 9, the mother TFT substrate 1000 has nine TFT substrates 100 in the horizontal direction, and seven TFT substrates 100 of A to F in the vertical direction. In other words, 63 TFT substrates 100 can be obtained from one mother TFT substrate 1000. The test line areas 110 are formed each between the upper TFT substrates 100 and the lower TFT substrates 100. For example, the test lines 102 of a TFT substrate 1A are formed in 1AT, and the test lines 102 of a TFT substrate 1B are formed in 1BT.

Figure 10:
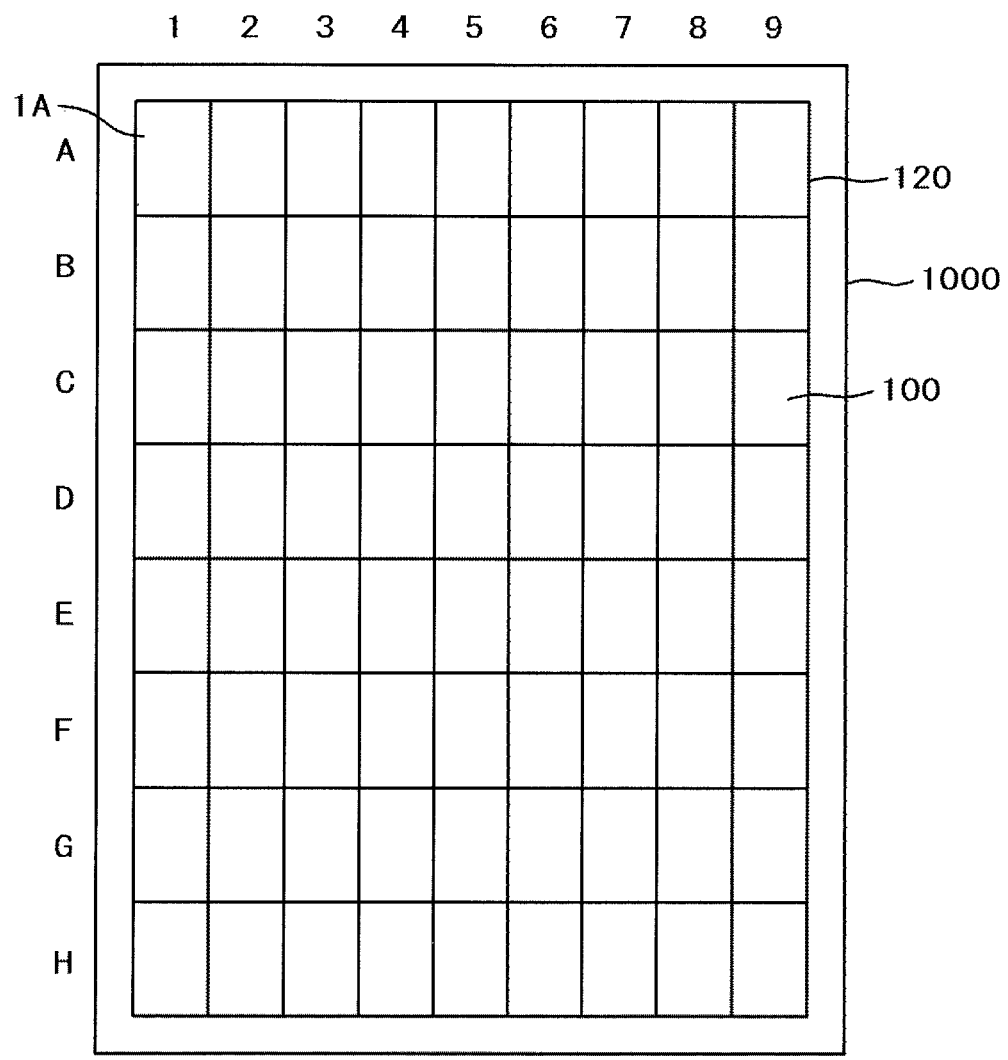
FIG. 10 is a top view of the arrangement of TFT substrates in the mother TFT substrate, in the case in which the TFT substrates do not have test lines.

On the other hand, when the test of the TFT substrate 100 is not performed in the mother TFT substrate 1000, the test lines 102 may not be necessary. As a result, as shown in FIG. 10, a larger number of TFT substrates 100 can be obtained from one mother TFT substrate 1000. For example, in FIG. 10, assuming that the size of the TFT substrate 100 is the same as the size in FIG. 9, the number of TFT substrates 100 that can be obtained from one mother TFT substrate 1000 is 72.

According to the following embodiments of the present invention, it is possible to test the TFT substrate 100 in the state of the mother TFT substrate 1000, without reducing the number of TFT substrates 100 to be obtained from one mother TFT substrate 1000.

First Embodiment

Figure 1:
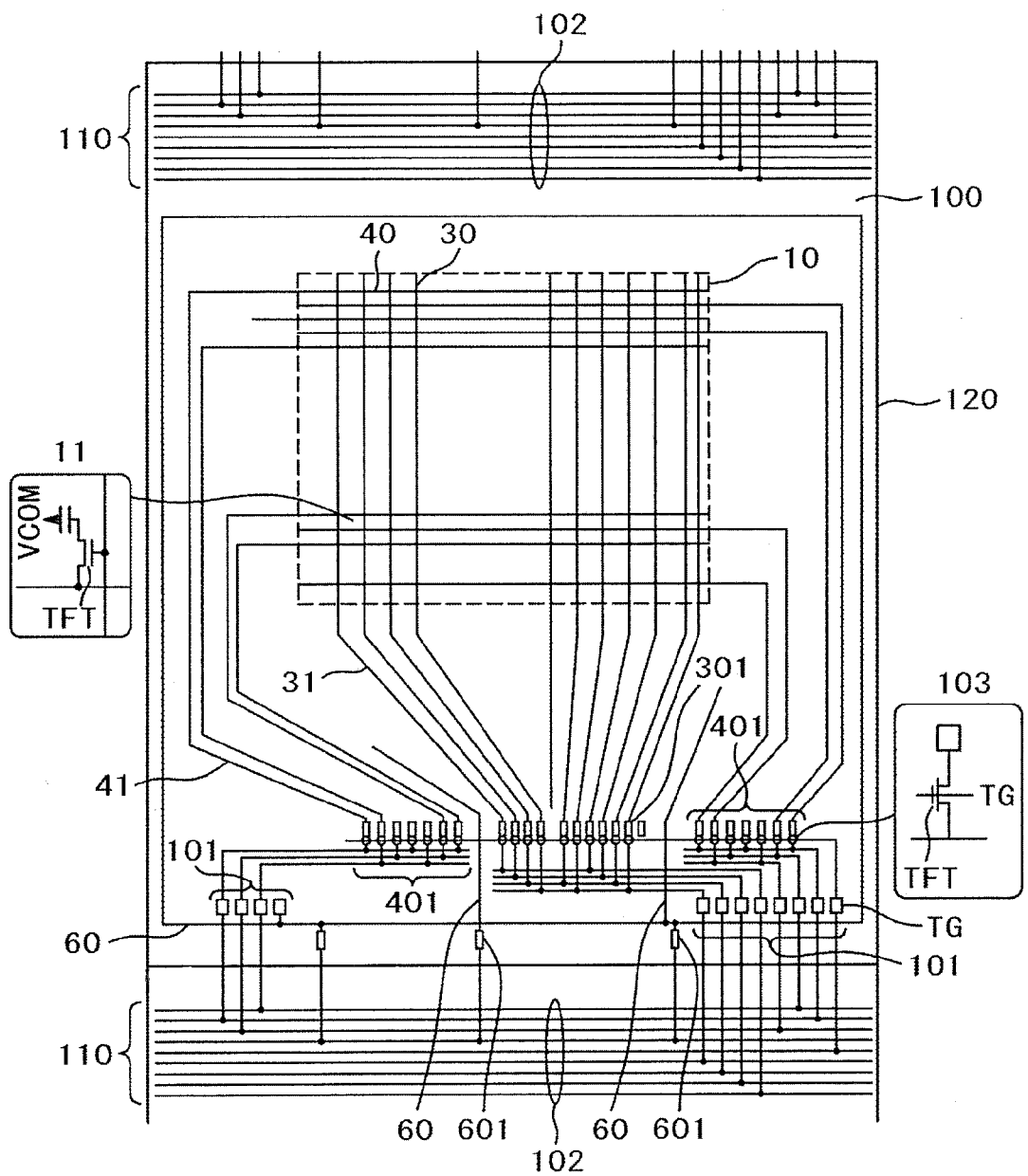
FIG. 1 is a wiring diagram in a TFT substrate of a liquid crystal display device according to a first embodiment.
Figure 2:
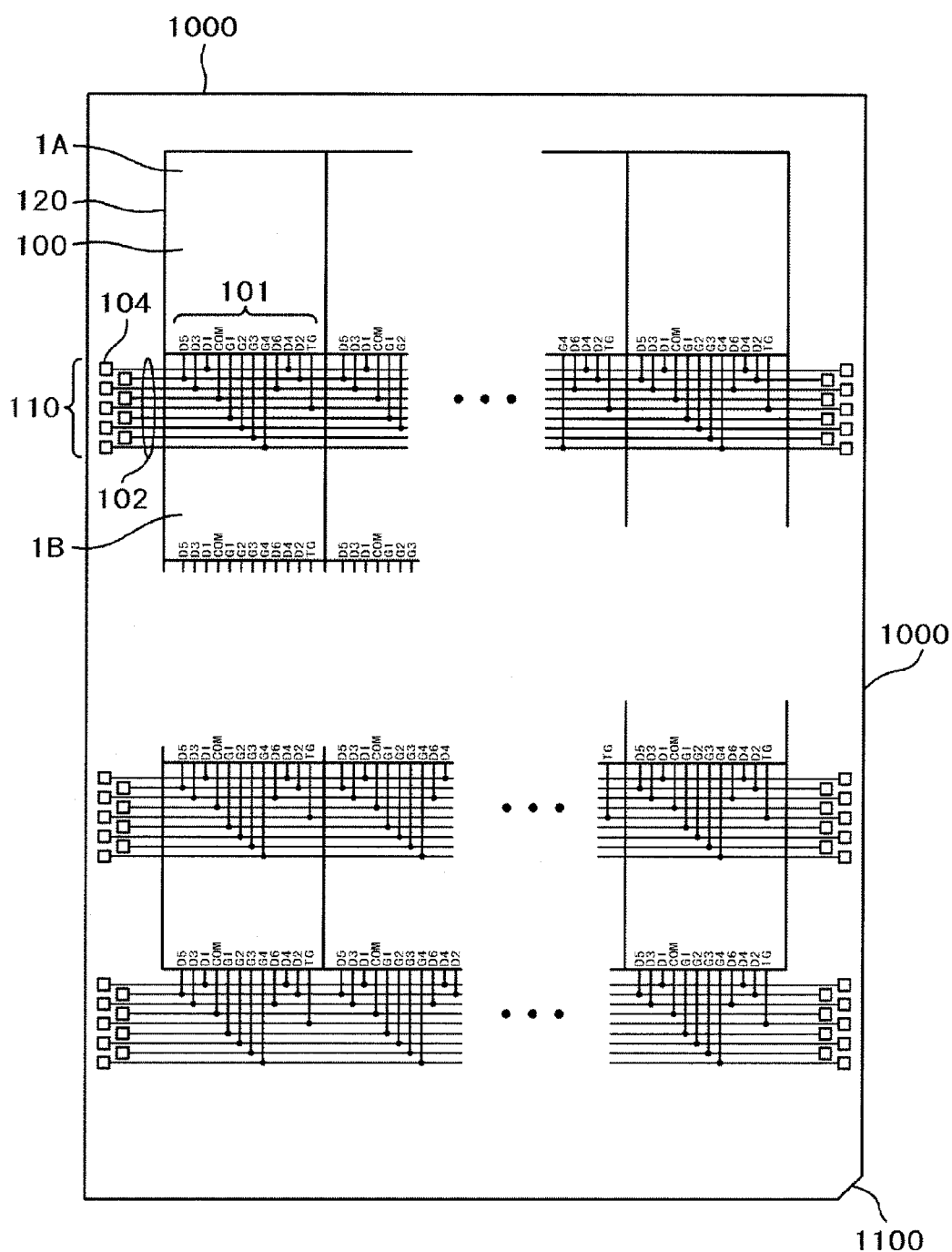
FIG. 2 is a top view of the arrangement of TFT substrates and test lines in a mother TFT substrate according to the first embodiment.

FIG. 1 is a top view of the TFT substrate 100 in the liquid crystal display device according to the present invention. FIG. 1 is a schematic diagram in which the terminal portion 150 and the test line area 110 are shown enlarged. In FIG. 1, the description of the same configuration as in FIG. 7 will be omitted. FIG. 1 is similar to FIG. 7 in that when the liquid crystal display device is completed as a product, it is used horizontally as shown in FIG. 6. FIG. 2 is a top view in which the TFT substrates 100, each shown in FIG. 1, are provided in the mother TFT substrate 1000.

In FIG. 1, the test lines 102 of the TFT substrate 100 surrounded by the cutting line 120 are formed below the specific TFT substrate 100. In other words, the test line area 110 of the specific TFT substrate 100 is formed in another TFT substrate 100 just below the specific TFT substrate. Further, in FIG. 1, the test lines 102 formed above the specific TFT substrate 100 are of another TFT substrate 100 just above the specific TFT substrate 100. In other words, in this embodiment, the test line area 110 of the specific TFT substrate 100 is not formed in the specific TFT substrate 100, but is formed in the TFT substrate 100 just below the specific TFT substrate 100.

The test of the TFT substrate 100 is performed in the state of the mother TFT substrate 1000, so that the test lines 102 have no effect on the test as long as the test lines 102 are conducted. After the completion of the mother panel, the TFT substrate 100 is individually separated from the mother TFT substrate 1000 along the cutting line 120. At this time, the test lines 102 of the separated TFT substrate 100 are divided by the cutting line 120 and do not function any more. However, the role of the testing lines 102 has been completed and there is no problem. Each liquid crystal cell can be tested by the test terminals 101 formed in the terminal portion 150 of the TFT substrate 100.

After the TFT substrate 100 is individually separated from the mother TFT substrate 1000, the test lines 102 for testing the other TFT substrate 100 are left in the separated TFT substrate 100. In this case, in general, the test lines 102 are floated, without being connected to the scan lines 30 or the image signal lines 40 in the specific TFT substrate 100. Also, the test line 102 is not connected to the common line 60 formed in the TFT substrate 100. There is another configuration in which the common line is not formed in the TFT substrate 100. In this case, the testing line 102 is not connected to the common line. In order to provide a connection to the other TFT substrate, leaders extend from the test lines 102 to the end of the TFT substrate. The leaders intersecting with the test terminals are formed by a conductive layer provided in a different layer from that of the test lines.

FIG. 6 shows the liquid crystal display device in which the present invention is used. In FIG. 6, the right short side corresponds to the upper short side of the TFT substrate 100 shown in FIG. 1. In FIG. 6, the scan line leaders 31 extend in the upper and lower sealing portions of the display area 10, in which the space is limited. Thus, the scan line leaders 31 are formed extending below the sealing material 15. However, the scan line leaders 31 are not present on the right short side in FIG. 6.

In the present invention, the test lines 102 are provided on the underside of the sealing material 15 on the right short side in FIG. 6. In this way, the space of the testing lines 102 is assured. In other words, by using the underside of the sealing material 15 on the right short side in FIG. 6, which has not been used in the past, the testing lines 102 can be formed without increasing the overall size of the TFT substrate 100. It is to be noted that the right short side in FIG. 6 corresponds to the upper short side of the TFT substrate 100 in FIG. 1.

Although the test line area 110 is magnified in FIG. 1, it actually can be made to 3 mm or less. In FIG. 6, the frame area from the outer end of the display area 10 to the end of the TFT substrate 100 is 2 mm or more. The test line area 110 of the specific TFT substrate 100 is typically housed in the frame portion of another TFT substrate 100 just below the specific TFT substrate 100 in the mother TFT substrate 1000.

FIG. 2 is a top view of the mother TFT substrate 1000 in which the TFT substrates 100 are arranged as described above. FIG. 2 is a schematic enlarged view of the test terminals 101, the test lines 102, the external test terminals 104 and the like. The display areas 10, the driving lines and the like of the TFT substrates 100 are omitted here. FIG. 2 is the same as FIG. 8 in that it shows 12 terminals as the test terminals 101 of the TFT substrate 100. Of the 12 test terminals 101, D1 to D6 are connected to the image signal lines 40, G1 to G3 are connected to the scan lines 30, COM is connected to the common line 60, and TG is connected to the gate of the test switch 103.

In FIG. 2, the test line area 110 for testing a specific TFT substrate 100 is formed on the upper side of another TFT substrate 100 just below the specific TFT substrate 100. This portion corresponds to the frame portion in the TFT substrate 100 just below the specific TFT substrate 100. In FIG. 2, the test lines 102 of the TFT substrate 100 provided in the bottom row are formed on the outside of the specific TFT substrate 100. The number of the test lines 102 formed within the test line area 110 is nine. The external test terminals 104 for supplying voltage to the test lines 102 are formed on both sides of the mother TFT substrate 1000. The test of the TFT substrate 100 is performed by the external test terminals 104.

In other words, in the present invention, the test lines 102 of the specific TFT substrate are formed in another TFT substrate 100 just below the specific TFT substrate. Thus, there is no need to discard the area of the test lines 102. As a result, the number of TFT substrates 100 to be obtained from one mother TFT substrate is not reduced. In addition, the test lines 102 of another TFT substrate 100 just above the specific TFT substrate are formed in the frame portion of the specific TFT substrate 100. This prevents an increase in the size of the TFT substrate 100.

Figure 3:
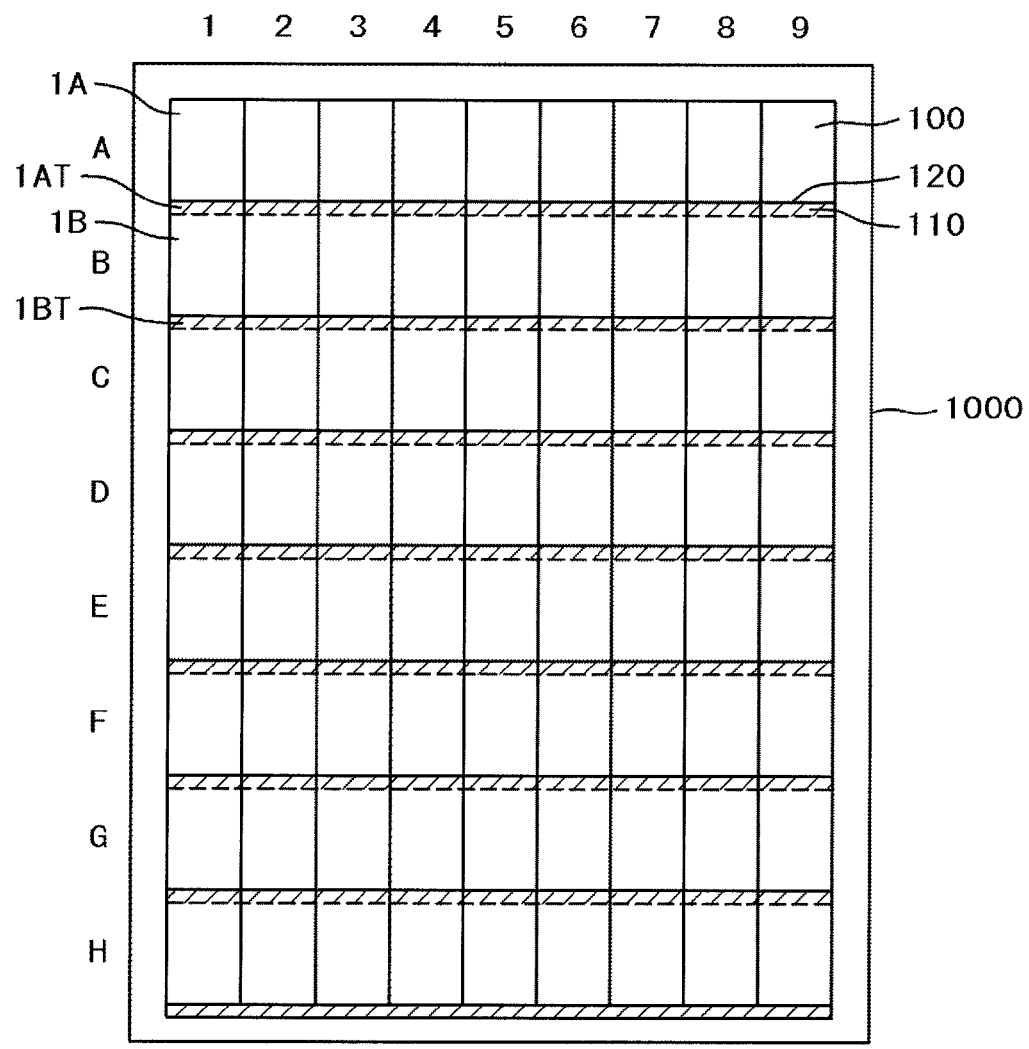
FIG. 3 is a top view of the arrangement of TFT substrates and test line areas in the mother TFT substrate according to the first embodiment.

FIG. 3 shows the TFT substrates 100 and the test line areas 110 in the mother TFT substrate 1000, in which the TFT substrates 100 are arranged as shown in FIG. 2. As shown in FIG. 3, each of the test line areas 110 of each TFT substrate 100 is formed in another TFT substrate 100 just below the specific TFT substrate 100, except for the test line areas 110 of the TFT substrates 100 provided in the bottom row. Thus, the number of the TFT substrates 100 to be obtained from one mother TFT substrate 1000 is the same as in the case in which the test lines 102 for testing the TFT substrates 100 are not provided as shown in FIG. 10.

Second Embodiment

The first embodiment has the configuration in which all of the test lines 102 of the specific TFT substrate are formed in another TFT substrate 100 just below the specific TFT substrate 100 in the mother TFT substrate 1000. However, all the test lines 102 of the specific TFT substrate 100 may not be housed in the frame portion of the TFT substrate 100 just below the specific TFT substrate 100. In such a case, some of the test lines 102 may be formed on or near the cutting line 120 of the specific TFT substrate 100.

The TFT substrate 100 is separated from the mother TFT substrate 1000, for example, in such a way that the glass substrate is scribed and fractured by an impact force applied to the glass substrate. In this case, when the glass substrate is scribed very close to the sealing material 15 for impact fracture (hereinafter referred to as scribing), the fracture surface is irregular due to the stress of the sealing material 15. For this reason, the vicinity of the cutting line 120 is a dead space in which nothing is formed. Such a dead space also occurs in the end of the terminal portion 150 of the specific TFT substrate 100.

Figure 4:
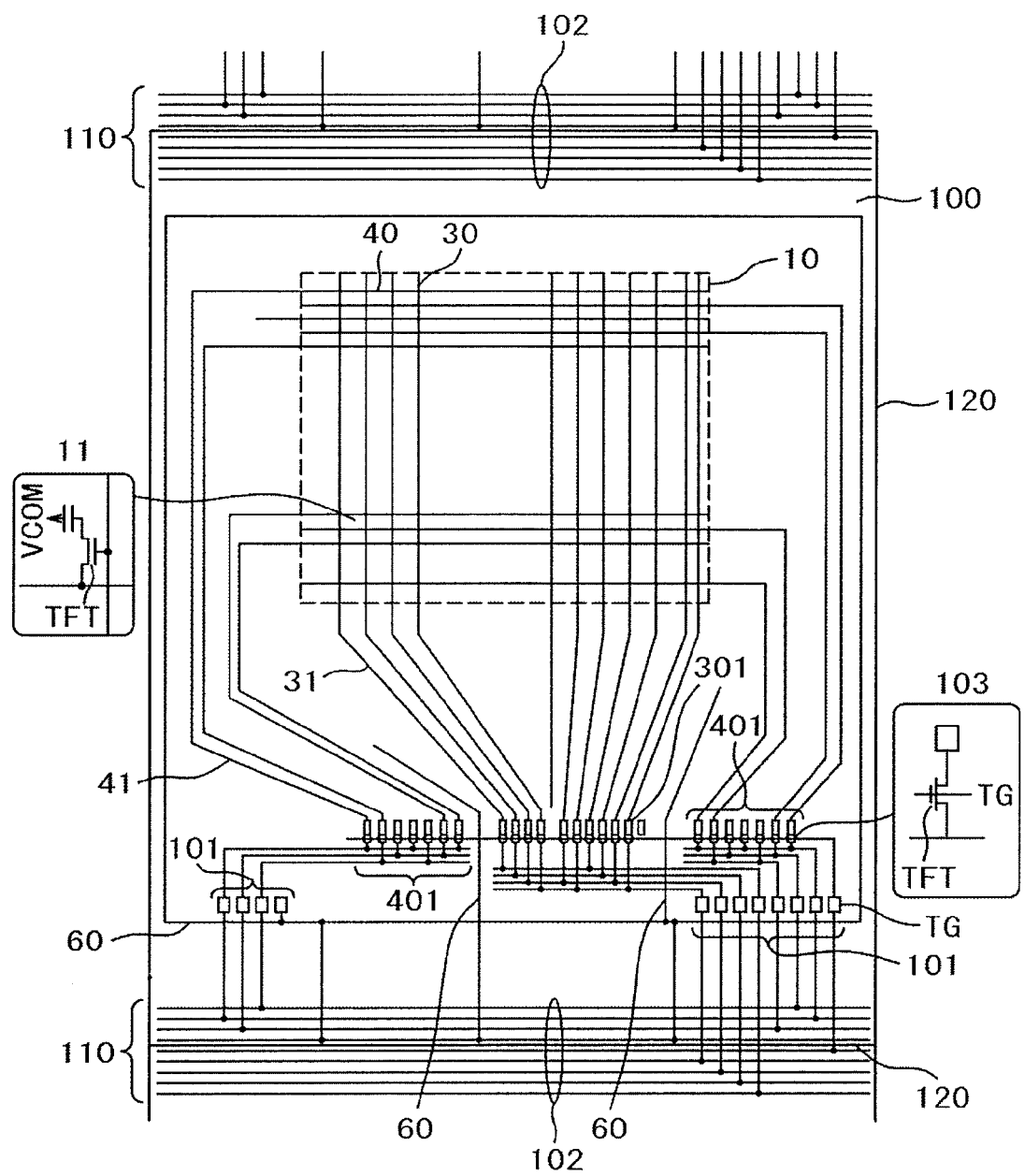
FIG. 4 is a wiring diagram of the TFT substrate of the liquid crystal display device according to a second embodiment.

In this embodiment, the test lines 102 are provided in the scribing area which is the dead space. The second embodiment is shown in FIG. 4. FIG. 4 is a top view of the TFT substrate 100 formed in the mother TFT substrate 1000. In FIG. 4, the test lines 102 are provided near the test terminals 101. Then, of the nine test lines 102 of the specific TFT substrate 100, four lines are housed in the specific TFT substrate 100, and the remaining five lines are housed in another TFT substrate 100 just below the specific TFT substrate 100.

Part of the test lines 102 are provided in the area of the cutting lines 120, namely, in the scribing area. The test lines 102 provided in this area disappear by scribing. However, the test of the TFT substrate 100 is completed when it is scribed, so that the disappearance of the test lines 102 is not a problem.

In FIG. 4, above the specific TFT substrate 100, there are provided five of the nine test lines 102 of the TFT substrate just above the specific substrate 100. Further, below the specific TFT substrate 100, there are provided four of the nine test lines 102 of the specific TFT substrate 100. In FIG. 4, the configuration is the same as that in FIG. 1, except for the position of the test lines 102 as well as the cutting line 120 for defining the profile of the TFT substrate 100. Thus, the repeated description will be omitted.

After the TFT substrate 100 is individually separated from the mother TFT substrate 1000, the test lines 102 for testing the other TFT substrate 100 left in the separated TFT substrate 100 are connected to the test terminals through the test switches 103. However, the test switches 103 are OFF in this state, so that the remaining test lines 102 have no effect on the specific TFT substrate 100. In general, the test lines 102 of the other TFT substrate 100 left in the specific TFT substrate 100 are floated without being connected to the scan lines 30 or the image signal lines 40 and the like.

Figure 5:
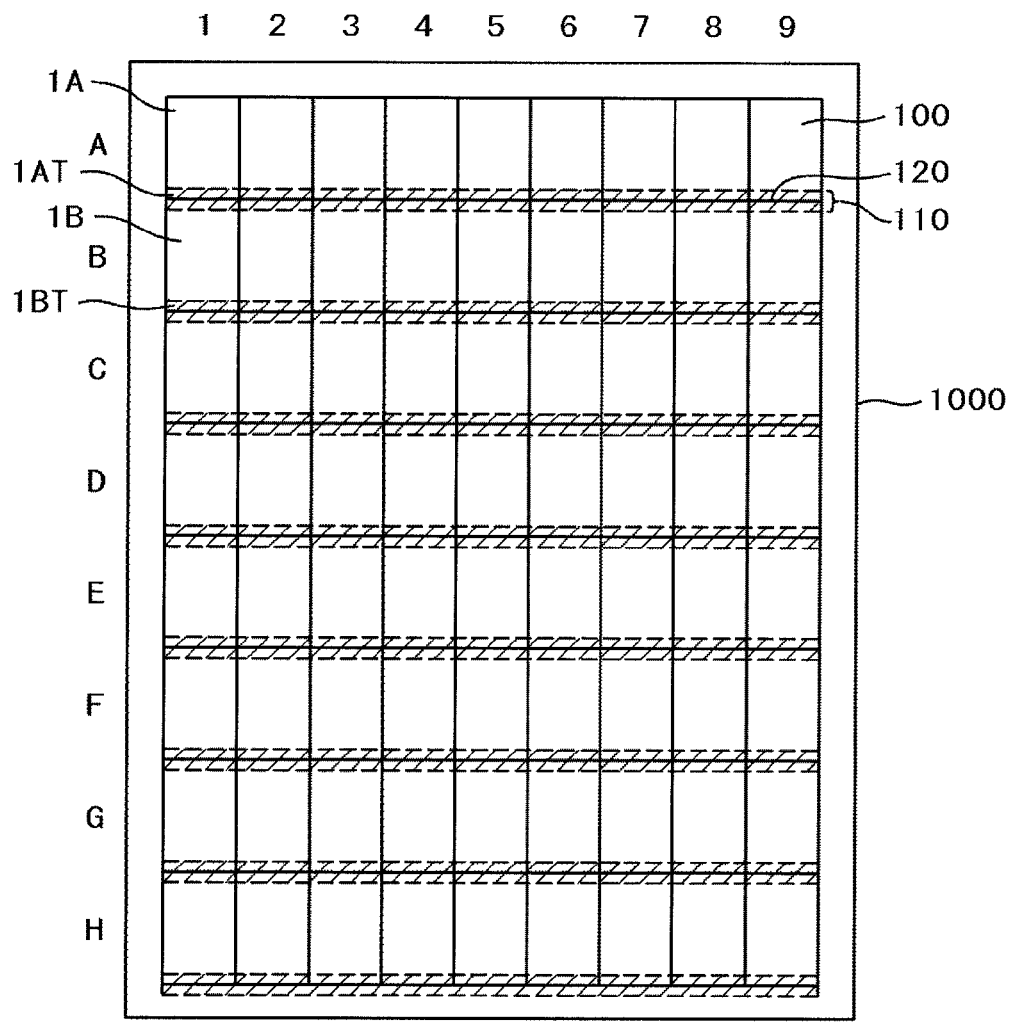
FIG. 5 is a top view of the arrangement of TFT substrates and test line areas in the mother TFT substrate according to the first embodiment.

FIG. 5 shows the arrangement of the TFT substrates 100 and the test line areas 110 in the mother TFT substrate 1000 according to the second embodiment. The test line area 110 of the specific TFT substrate 100 is provided both in the specific test line area 110, and in another TFT substrate 100 just below the specific TFT substrate 100. For example, in FIG. 5, the test line area 1AT of the TFT substrate 1A is provided below the TFT substrate 1A and above the TFT substrate 1B. In FIG. 5, the number of the TFT substrates 100 to be obtained from one mother TFT substrate 1000 is the same as in the case in which the test lines 102 for testing the TFT substrates 100 are not provided.

As described above, according to this embodiment, the arrangement of the test lines 102 is also formed in the scribing area in order to effectively use the space in the TFT substrate 100. As a result, the overall size of the TFT substrate 100 is not increased. In addition, the number of the TFT substrates 100 to be obtained from one mother TFT substrate 1000 can be as many as the number of the case in which the TFT substrate test is not performed.

Third Embodiment

The first and second embodiments have been described with respect to the liquid crystal display device. A third embodiment can be applied not only to the liquid crystal display device, but also to an organic electroluminescence (EL) display device. The organic EL display device includes a device substrate and a sealing substrate. The device substrate includes a display area in which pixels, each having a driving TFT, a switch TFT, and an organic EL light emitting layer are arranged in a matrix form. In the display area, scan lines extend in a first direction and are arranged in a second direction perpendicular to the first direction. Image signal lines extend in the second direction and are arranged in the first direction. Then, power lines extend in the second direction and are arranged in the first direction. The power lines supply power to the organic EL light emitting layers.

The organic EL light emitting layers formed in the device substrate have characteristics that are degraded by water. Thus, the surface of the device substrate on which the organic EL light emitting layers are formed, is sealed by the sealing substrate for protection. A sealing material is formed in the periphery of the sealing substrate. The device substrate and the sealing substrate are bonded together by the sealing material.

The device substrate is made larger than the sealing substrate. A terminal portion is formed in the portion of the device substrate extending beyond the sealing substrate. Driving terminals and test terminals are formed in the terminal portion. As described above, the configuration of the device substrate of the organic EL display device is similar to the configuration of the TFT substrate in the liquid crystal display device.

Also in the organic EL display device, plural device substrates are formed in a mother device substrate, and plural sealing substrates are formed in a mother sealing substrate in order to increase the production efficiency. This is the same as in the case of the liquid crystal display device. Thus, it is possible to significantly increase the production efficiency by detecting disconnection, short circuit, or other defects in the device substrate in the state of the mother device substrate. In other words, the post process is no longer applied to the defective substrate. In addition, the device substrate having many defects can be prevented from being conveyed to the post process.

When the configuration described in the first or second embodiment is applied to the device substrate in the organic EL display device, it is possible to form the test terminals or test lines of the device substrate without increasing the overall size of the device substrate, and without reducing the number of device substrates to be obtained from one mother device substrate.

What is claimed is:

1. A liquid crystal display device comprising:
a TFT substrate including a display area in which pixels each having a pixel electrode and a TFT are arranged in a matrix form, as well as a terminal portion;
a counter substrate disposed opposite to the TFT substrate; and
a sealing material formed in the periphery to bond the TFT substrate and the counter substrate together;
wherein the display area includes scan lines extending in a first direction and arranged in a second direction, image signal lines extending in the second direction and arranged in the first direction, and a common line;
wherein a driving terminal and a test terminal are formed in the terminal portion;
wherein a plurality of lines are formed on the side opposite to the side on which the terminal portion is formed;
wherein the plurality of lines are not connected to the scan lines, the image signal lines, and the common line, and are arranged parallel to the side opposite to the side on which the terminal portion is formed;
wherein the plurality of lines are used for testing a TFT substrate of another liquid crystal display device.

2. A liquid crystal display device comprising:
a TFT substrate including a display area in which pixels each having a pixel electrode and a TFT are arranged in a matrix form, as well as a terminal portion;
a counter substrate disposed opposite to the TFT substrate; and
a sealing material formed in the periphery to bond the TFT substrate and the counter substrate together,
wherein the display area includes scan lines extending in a first direction and arranged in a second direction, and image signal lines extending in the second direction and arranged in the first direction,
wherein a driving terminal and a test terminal are formed in the terminal portion,
wherein a plurality of first lines are formed between the side on which the terminal portion is formed, and the test terminal,
wherein the plurality of first lines are connected to the test terminal, and are arranged parallel to the side on which the terminal portion is formed,
wherein a plurality of second lines are formed on the side opposite to the side on which the terminal portion is formed,
wherein the plurality of second lines are not connected to the scan lines or the image signal lines, and are arranged parallel to the side opposite to the side on which the terminal portion is formed, and
wherein leaders extend from the plurality of second lines to the side opposite to the side on which the terminal portion is formed.

3. The liquid crystal display device according to claim 2, wherein the plurality of first and second lines are used for the test of the TFT substrate.

* * * * *